(12) United States Patent
Zhu et al.

(10) Patent No.: US 10,061,416 B2
(45) Date of Patent: Aug. 28, 2018

(54) TOUCH CONTROL DISPLAY DEVICE AND A PREPARATION METHOD THEREOF

(71) Applicants: Kunshan New Flat Panel Display Technology Center Co., Ltd., Kunshan, Jiangsu (CN); Kunshan Go-Visionox Opto-Electronics Co., Ltd., Kunshan, Jiangsu (CN)

(72) Inventors: Shaopeng Zhu, Jiangsu (CN); Hideo Hirayama, Jiangsu (CN); Xiuqi Huang, Jiangsu (CN)

(73) Assignees: Kunshan New Flat Panel Display Technology Center Co., Ltd., Kunshan, Jiangsu (CN); Kunshan Go-Visionox Opto-Electronics Co., Ltd., Kunshan, Jiangsu (CN)

(*) Notice: Subject to any disclaimer, the term of this patent is extended or adjusted under 35 U.S.C. 154(b) by 45 days.

(21) Appl. No.: 15/107,496

(22) PCT Filed: Dec. 25, 2014

(86) PCT No.: PCT/CN2014/094917
§ 371 (c)(1),
(2) Date: Jun. 23, 2016

(87) PCT Pub. No.: WO2015/096764
PCT Pub. Date: Jul. 2, 2015

(65) Prior Publication Data
US 2016/0313837 A1    Oct. 27, 2016

(30) Foreign Application Priority Data

Dec. 27, 2013   (CN) .......................... 2013 1 0737829

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *G09G 3/3208* (2013.01);
(Continued)

(58) Field of Classification Search
CPC .... G06F 3/0416; G06F 1/3262; G06F 3/0412; G06F 3/044; G06F 2203/04102;
(Continued)

(56) References Cited

U.S. PATENT DOCUMENTS

| 2009/0085891 A1 | 4/2009 | Yang et al. |
| 2010/0007616 A1 | 1/2010 | Jang |

(Continued)

FOREIGN PATENT DOCUMENTS

| CN | 101626017 | 1/2010 |
| CN | 101894856 | 11/2010 |

(Continued)

OTHER PUBLICATIONS

Reducing capacitive touchscreen cost in mobile phones; Travor Davis, Cypress Semiconductor—Feb. 25, 2013.
(Continued)

*Primary Examiner* — Rodney Amadiz
(74) *Attorney, Agent, or Firm* — Womble Bond Dickinson (US) LLP

(57) ABSTRACT

There is provided a touch control display device, wherein, second electrodes in the organic light-emitting diodes are connected in series in the same layer in a first direction so as to form a plurality of first conductive units (105); the touch control layer comprises a plurality of second conductive units (107) arranged in parallel in a second direction, the first conductive units (105) and the second conductive units (107) are configured to be insulated from each other and to form a cross network. A touch control structure is formed by the cooperation of the first conductive units (105) consisting (Continued)

of the second electrodes and the second conductive units (107) in the touch control layer, thereby reducing the thickness of the touch control display device. Only the first encapsulation layer (106), the touch control layer and the second encapsulation layer (108) are configured on the light-exiting surface of the organic light-emitting diodes, which not only has a compact structure but also effectively increases the light-emitting efficiency of the touch control display device. There is also provided a preparation method of the touch control display device, wherein, during the preparation process of the second electrodes, the second electrodes are formed into first conductive units (105) that cooperate with the second conductive units (107) in the touch control layer to constitute a touch control structure, which is a simple preparation method with low process cost.

12 Claims, 2 Drawing Sheets

(51) Int. Cl.
  *H01L 27/32*  (2006.01)
  *G09G 3/3208*  (2016.01)
  *H01L 51/52*  (2006.01)
  *H01L 51/56*  (2006.01)

(52) U.S. Cl.
  CPC ........ *H01L 27/323* (2013.01); *H01L 51/5253* (2013.01); *H01L 51/56* (2013.01); *G06F 2203/04103* (2013.01); *H01L 27/3244* (2013.01); *H01L 51/5256* (2013.01); *H01L 2227/323* (2013.01)

(58) Field of Classification Search
  CPC . G06F 2203/04103; G06F 2203/04111; H01L 51/56; H01L 51/5253; H01L 27/3244; H01L 27/323; H01L 27/3276; H01L 2251/5338; H01L 51/5256; G09G 3/3208
  See application file for complete search history.

(56) References Cited

U.S. PATENT DOCUMENTS

| | | | |
|---|---|---|---|
| 2010/0033443 A1 | 2/2010 | Hashimoto | |
| 2010/0110041 A1 | 5/2010 | Jang | |
| 2012/0120011 A1 | 5/2012 | Teng et al. | |
| 2012/0249401 A1 | 10/2012 | Omoto | |
| 2012/0319961 A1 | 12/2012 | Liu | |
| 2013/0026501 A1 | 1/2013 | Liu | |
| 2013/0057497 A1 | 3/2013 | Cho et al. | |
| 2013/0314372 A1 | 11/2013 | Chang et al. | |
| 2014/0048854 A1 | 2/2014 | Wang et al. | |
| 2014/0145979 A1* | 5/2014 | Lee | G06F 3/0412 345/173 |
| 2015/0194470 A1 | 7/2015 | Hwang | |

FOREIGN PATENT DOCUMENTS

| | | |
|---|---|---|
| CN | 102566837 | 7/2012 |
| CN | 102760405 | 10/2012 |
| CN | 101937285 | 11/2012 |
| CN | 102830827 | 12/2012 |
| CN | 102830879 | 12/2012 |
| CN | 102981669 | 3/2013 |
| JP | 2003-341003 | 12/2003 |
| JP | 2004-268311 | 9/2004 |
| JP | 2010-39816 A | 2/2010 |
| JP | 2012-208263 | 10/2012 |
| JP | 2013-15989 | 1/2013 |
| JP | 2013-20530 | 1/2013 |

OTHER PUBLICATIONS

Supplemental European Search Report for EP app No. 14 87 3309 dated Dec. 5, 2016.
International Preliminary Report on Patentability for PCT app No. PCT/CN2014094917 dated Jun. 28, 2016.
English translation of JP 2013-20530 specification.
English translation of JP 2013-15989 specification.
English translation of JP 2003-341003 specification.
English translation of JP 2004-268311 specification.
Japanese Office Action for JP 2016-559489 dated Mar. 9, 2017.
Decision of Refusal for JP 2016-559489 dated Jun. 29, 2017, with English translation.
Japanese Report on Reconsideration by Examiner for JP 2016-559489 dated Jan. 4, 2018.

* cited by examiner

TOUCH CONTROL DISPLAY DEVICE AND A PREPARATION METHOD THEREOF

TECHNICAL FIELD

The present invention relates to the field of display technology, and in particular relates to an organic light-emitting display device with embedded touch control structure as well as a preparation method thereof.

BACKGROUND OF THE INVENTION

Touch Panel, also known as Touch Screen or Touch Control Panel, is an induction type display device that is able to receive input signal from a contactor or the like, and it is widely used in various electronic products. According to different operation principles and information transmitting media, there are four types of Touch Panels: resistance type, capacitive type, infrared ray type, and surface sound wave type.

Capacitive Touch Panel (abbreviated as CTP) controls the screen by utilizing electric current induction of a human body. On the basis of detected change of electric capacity of the contacted area, the location of the contacting finger is calculated with accuracy up to 99% and respond time less than 3 ms. Since CTP has advantages such as high sensitivity and easily achievable multi-point touch control, CTP gradually becomes a mainstream Touch Panel applied in electronic products such as smart-phones and tablet computers.

In prior art, according to the relative position between the touch control stacked layer structure and the display panel, CTP can be divided into different technical architectures of out-cell (the touch control device is hanging out of the display panel), on-cell (the touch control device is configured on the display panel), and in-cell (the touch control device is integrated within the display panel). Although the out-cell technology and the on-cell technology are mature and have been widely used along with medium and small sized display panel, and OFS (One Film Solution) of the out-cell technology can be used in an organic electro-luminescent display device to make it possible for flexible touch control display, however, the in-cell technology can make the display panel lighter and thinner, with higher light transmittance and lower power consumption, as well as achievable flexibility, and therefore the in-cell technology is considered to be an ultimate solution for touch control display, especially for touch control of organic electro-luminescent display, which will gradually become a development mainstream of touch control technology in organic electro-luminescent display devices.

Chinese patent literature CN102830827A discloses a touch control display device and preparation method thereof, wherein the touch control display device comprises a first touch control sensing layer formed on the surface of an upper substrate, an organic light-emitting component formed on the surface of a lower substrate, and a composite layer formed by a combination of sensing electrodes and organic light-emitting electrodes. In this touch control display device, the second sensing electrodes that originally belongs to a second touch control sensing layer and the opposite electrodes that originally belongs to an opposite electrode layer of the organic light emitting component are mixed or combined in a single layer. Because the first sensing electrodes and the second sensing electrodes are respectively formed in the first touch control sensing layer and in the composite layer, an insulation layer is required to be arranged between these two layers. As such, the overall complexity of the preparation steps can be reduced, and the manufacturing yield of the product can be effectively increased.

In the above-mentioned touch control display device, although the thickness of the touch control display device can be reduced to a certain extent by mixing the second sensing electrodes and the opposite electrodes in a single layer, however, as the other part of the touch control device, the first touch control sensing layer is still required to be arranged on the surface of the upper substrate, therefore, this touch control display device still pertains to an out-cell structure which inevitably has the problems of large thickness and low light transmittance.

More importantly, in this patent literature, the second sensing electrodes and the organic light-emitting electrodes are combined in a single layer, which easily causes a problem of signal cross-talk and thus has severe adverse influence on the display quality of the touch control display device. Besides, in the first embodiment of this patent literature, there is no physical insulation layer provided between the first sensing electrodes and the second sensing electrodes, and as a result, in order to ensure insulation between the first sensing electrodes and the second sensing electrodes, not only a sufficient insulation space needs to be retained between the first sensing electrodes and the second sensing electrodes, which leads to that the thickness of the touch control display device cannot be further reduced, but also the upper substrate must have very little flexibleness, so as to prevent the first sensing electrodes from touching the second sensing electrodes, therefore, this touch control display device cannot be made flexible or with a large dimension. In another embodiment of this patent literature, the first sensing electrodes are arranged on the upper surface of the upper substrate, i.e. the first sensing electrodes and the second sensing electrodes are respectively arranged on two sides of the upper substrate, and as a result, although the problem of inability to achieve flexibility and large dimension as in the first embodiment can be avoided, however, the vertical distance between the first sensing electrodes and the second sensing electrodes is too long, which has severe adverse influence on the sensitivity of touch control; furthermore, in order to protect the first sensing electrodes from being damaged by external force, a protection layer is inevitably required to be formed above the first sensing electrodes, which adds to the complexity of the preparation steps, further increases the thickness of the touch control display device, lowers the light transmittance, and also adversely affects the aesthetic appearance of the touch control display device.

SUMMARY OF THE INVENTION

As such, a technical problem to be solved by the present invention is that the touch control display devices of prior art have large thickness and complicated preparation processes, and an objective of the present invention is to provide an organic light-emitting display device with embedded touch control structure that has simple preparation process, small thickness and achievable flexibility, as well as to provide a preparation method thereof.

In order to solve the above-mentioned technical problem, the present invention provides the following technical solutions:

A touch control display device in accordance with the present invention comprises a substrate, and a plurality of organic light-emitting diodes arranged on the substrate, each of which includes a first electrode, an organic light-emitting layer and a second electrode stacked in sequence, the first electrodes being arranged close to the substrate;

the touch control display device further comprises a first encapsulation layer, a touch control layer and a second encapsulation layer stacked in sequence upon the organic light-emitting diodes;

the first electrodes in all of the organic light-emitting diodes are separately arranged;

the second electrodes in each row of the organic light-emitting diodes are connected in series in the same layer in a first direction so as to form a plurality of first conductive units;

the touch control layer comprises a plurality of second conductive units arranged in parallel in a second direction, the first conductive units and the second conductive units are configured to be insulated from each other and to form a cross network.

Preferably, the first conductive units and the second conductive units have the same pattern.

Preferably, the touch control layer has a thickness of 5 nm-200 nm.

Preferably, the second electrodes have a thickness of 1 nm-500 nm.

Preferably, the first direction is orthogonal to the second direction.

Preferably, the first conductive units and the second conductive units are each formed as a transparent or semi-transparent conductive layer.

Preferably, the first encapsulation layer and the second encapsulation layer each comprises a single layer of or alternately arranged multiple layers of organic films and/or inorganic films.

Preferably, the first encapsulation layer has a thickness of 50 nm-5 μm.

Preferably, the second encapsulation layer has a thickness of 50 nm-5 μm.

Preferably, a drive circuit layer is arranged between the substrate and all of the organic light-emitting diodes, circuits in the drive circuit layer are adapted for actuating all of the organic light-emitting diodes.

A preparation method of the touch control display device in accordance with the present invention comprises the following steps:

S1, forming separately arranged first electrodes on the substrate, and forming an organic light-emitting layer on the first electrodes;

S2, forming second electrodes on the organic light-emitting layer, wherein the second electrodes are connected in series in the same layer in a first direction so as to form a plurality of first conductive units arranged in parallel;

S3, forming a first encapsulation layer that covers all of the first conductive units on the substrate;

S4, forming a conductive layer on the first encapsulation layer, and this conductive layer is patterned into a plurality of second conductive units arranged in parallel in a second direction, wherein the first conductive units and the second conductive units form a cross network while being insulated from each other;

S5, forming a second encapsulation layer that covers all of the second conductive units on the substrate.

Preferably, before the step S1, the method further comprises a step of forming a drive circuit layer on the substrate.

Preferably, in the step S4, the second conductive units are directly formed by means of mask or by means of printing.

Compared to prior art, the aforementioned technical solutions of the present invention have the following advantages:

1. The touch control display device of the present invention comprises a substrate and a plurality of organic light-emitting diodes that are arranged on the substrate and separated from one another, wherein, a first encapsulation layer, a touch control layer and a second encapsulation layer are also arranged in sequence upon the organic light-emitting diodes; the first electrodes in all of the organic light-emitting diodes are separately arranged; the second electrodes in the organic light-emitting diodes are connected in series in the same layer in a first direction so as to form a plurality of first conductive units; the touch control layer comprises a plurality of second conductive units arranged in parallel in a second direction, the first conductive units and the second conductive units are configured to be insulated from each other and to form a cross network. A touch control structure is formed by the cooperation of the first conductive units consisting of the second electrodes and the second conductive units in the touch control layer, thereby greatly reducing the thickness of the touch control display device. Only the first encapsulation layer is used for insulation between the first conductive units and the second conductive units, which has a compact structure.

2. In the touch control display device of the present invention, a touch control structure is formed by the cooperation of the first conductive units consisting of the second electrodes of the organic light-emitting diodes and the second conductive units in the touch control layer, therefore, only the first encapsulation layer, the touch control layer and the second encapsulation layer are configured on the light-exiting surface of the organic light-emitting diodes, which effectively increases the light-emitting efficiency of the touch control display device, and, compared to those touch control display devices of prior art, effectively reduces the complexity of the preparation process and increases the product yield.

3. In the preparation method of the touch control display device of the present invention, during the preparation process of the second electrodes, the second electrodes are formed into the first conductive units that cooperate with the second conductive units in the touch control layer to constitute a touch control structure, which is a simple preparation method with low process cost.

BRIEF DESCRIPTION OF THE DRAWINGS

In order to make the subject matter of the present invention easy and clear to understand, hereinafter, the present invention will be further described in detail according to specific embodiments of the present invention and with reference to the appended drawings, wherein.

Figure 1:
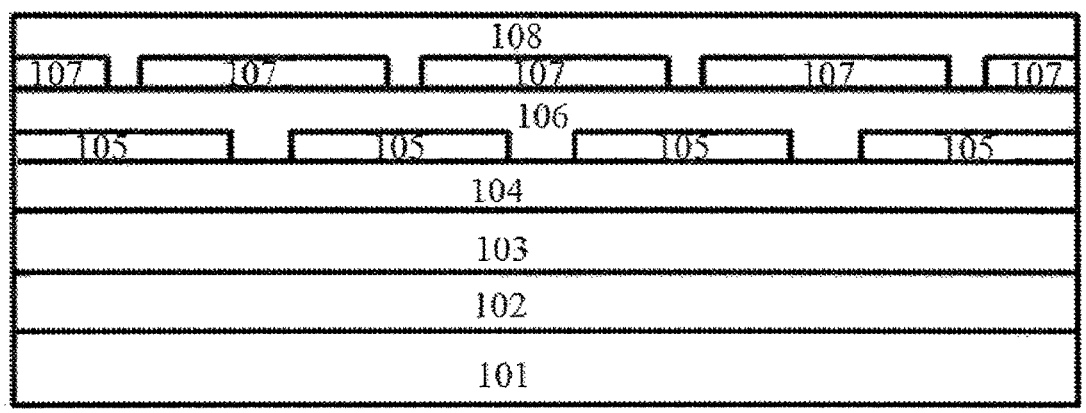
FIG. 1 is a structural schematic diagram of a touch control display device in accordance with Embodiment 1 of the present invention.

The reference numerals in the drawing are explained as follows: 101-substrate, 102-drive circuit layer, 103-first electrode layer, 104-organic light-emitting layer, 105-first conductive unit, 106-first encapsulation layer, 107-second conductive unit, 108-second encapsulation layer.

DETAILED DESCRIPTION OF EMBODIMENTS

In order to more clearly illustrate the purpose, technical solution and advantages of the present invention, hereinafter, specific embodiments of the present invention will be further described in detail with reference to the appended drawings.

The present invention can be implemented in many different forms, and should not be interpreted to be limited to the embodiments described herein. On the contrary, by providing these embodiments, the present disclosure is made complete and thorough, and the inventive concept of the present invention is sufficiently conveyed to those skilled in the art, wherein the present invention is defined by the Claims. In the appended drawings, for the sake of clarity, dimensions and relative sizes of layers and areas might be exaggerated. It should be understood that, when one element such as a layer, an area or a substrate plate is described as "formed on" or "configured on" another element, this one element may be configured directly upon that another element, or there may exist intermediate element(s). On the contrary, when one element is described as "directly formed upon" or "directly configured upon" another element, there exist no intermediate element.

Embodiment 1

The present embodiment provides a touch control display device, as shown in FIG. 1, which comprises a substrate 100, organic light-emitting diodes arranged on the substrate 100, as well as a first encapsulation layer 106, a touch control layer and a second encapsulation layer 108 stacked in sequence upon the organic light-emitting diodes. Each of the organic light-emitting diodes includes a first electrode, an organic light-emitting layer 104 and a second electrode stacked in sequence. The first electrodes in all of the organic light-emitting diodes are separately arranged. The second electrodes in each row of the organic light-emitting diodes are connected in series in the same layer in a first direction so as to form a plurality of first conductive units 105.

The touch control layer comprises a plurality of second conductive units 107 arranged in parallel in a second direction, the first conductive units 105 and the second conductive units 107 are configured to be insulated from each other and to form a cross network.

A touch control structure is formed by the cooperation of the first conductive units 105 consisting of the second electrodes and the second conductive units 107 in the touch control layer, thereby greatly reducing the thickness of the touch control display device. Furthermore, only the first encapsulation layer 106 is used for insulation between the first conductive units 105 and the second conductive units 107, which has a compact structure.

In addition, only the first encapsulation layer 106, the touch control layer and the second encapsulation layer 108 are configured on the light-exiting surface of the organic light-emitting diodes, which effectively increases the light-emitting efficiency of the touch control display device, and compared to those touch control display devices of prior art, effectively reduces the complexity of the preparation process and increases the product yield.

In this embodiment, the first direction is orthogonal to the second direction. As in other embodiments of the present invention, the first direction may intersect with the second direction by any angle.

Since the first electrodes in all of the organic light-emitting diodes in the touch control display device are formed in the same layer, only a first electrode layer 103 containing all of the first electrodes is shown in FIG. 1; and since the organic light-emitting layers 104 in all of the organic light-emitting diodes are formed in the same layer, only a single layer containing all of the organic light-emitting layers 104 is shown in FIG. 1.

The substrate 101 is selected from but not limited to a polymer flexible substrate or a glass substrate, preferably in this embodiment is a polymer flexible substrate, in particular is a polyimide (PI) substrate.

The first electrode and the organic light-emitting layer 104 have the same material and thickness as prior art, and in this embodiment, the first electrode is indium tin oxide (ITO), while the organic light-emitting layers 104 in the respective organic light-emitting diodes have different materials. In order to meet the display requirements, all of the organic light-emitting diodes are divided into several types of pixel units, each pixel unit at least includes two of a red light diode, a green light diode and a blue light diode, and the light-emitting color depends on the organic light-emitting layers 104. In this embodiment, the red light-emitting layer is 4-(dicyanomethylene)-2-methyl-6-(4-dimethylamino-styryl)-4H-pyrane (DCM), the green light-emitting layer is 3-(2'-benzothiazolyl)-7-diethylamino-coumarin (coumarin 6), and the blue light-emitting layer is 9,10-di-(($\beta$-naphthyl)-anthracene. Other embodiments of the present invention are not limited to these.

As in other embodiments of the present invention, the organic light-emitting diodes further comprises one or more selected from an electron injection layer, an electron transport layer, a hole blocking layer, an electron blocking layer, a hole transport layer and a hole injection layer arranged between the first electrode and the second electrode.

Both of the first conductive units 105 and the second conductive units 107 are formed as a transparent or semi-transparent conductive layer.

The second electrode that constitutes the first conductive units 105 is selected from but not limited to silver, magnesium silver alloy, a stacked layer of magnesium silver alloy/silver, calcium, sodium, aluminum, ITO, while in this embodiment is preferably a magnesium silver alloy layer. The second electrode has a thickness of 1 nm-500 nm, while in this embodiment preferably has a thickness of 5 nm.

The second conductive unit 107 is selected from but not limited to transparent conductive oxide such as indium tin oxide (ITO), aluminum-doped zinc oxide (AZO) and fluorine-doped tin oxide (FTO), conductive polymer such as PEDOT:PSS, silver nanowire, graphene, carbon nanotube, while in this embodiment is preferably an ITO layer. The second conductive unit 107 has a thickness of 5 nm-5 μm, while in this embodiment preferably has a thickness of 50 nm.

Both of the first encapsulation layer 106 and the second encapsulation layer 108 comprise a single layer of or multiple alternately arranged layers of organic films and/or inorganic films. The inorganic film is selected from but not limited to silicon nitride film, silicon oxide film. The organic film is selected from but not limited to ultraviolet ray curable resin film, silicon dioxide—acrylic resin composite material film.

In this embodiment, the first encapsulation layer 106 is preferably formed by deposition of alternately arranged four pairs of polyacrylic ester layers and aluminum oxide layers, wherein each of the polyacrylic ester layers has a thickness of 1.5 μm and each of the aluminum oxide layers has a thickness of 50 nm. The second encapsulation layer 108 is preferably a silicon dioxide—acrylic resin composite material layer with a thickness of 5 μm.

As in other embodiments of the present invention, the first encapsulation layer 106 may have a thickness of 50 nm-5 μm.

As in other embodiments of the present invention, the second encapsulation layer 108 may have a thickness of 50 nm-5 µm.

A drive circuit layer 102 is also arranged between the substrate 101 and all of the organic light-emitting diodes, and circuits in the drive circuit layer 102 are adapted for actuating all of the organic light-emitting diodes. In this embodiment, the drive circuit is preferably an active driving circuit, i.e. each of the organic light-emitting diodes is driven by a sub-circuit composed of at least two thin film transistors and one capacitor, and the sub-circuits together form a drive circuit array, with the same specific circuit arrangement as prior art. According to different types of thin film transistors that are used, the drive circuit array can be classified as one of the array types of low temperature polycrystalline silicon thin film transistor array, metal oxide thin film transistor array, organic thin film transistor array, while in this embodiment the drive circuit array is preferably a low temperature polycrystalline silicon thin film transistor array The preparation method of the touch control display device comprises the following steps:

S1, forming an ITO layer on the substrate 101 by means of evaporation coating, the ITO layer then being formed into separately arranged first electrodes by means of photo-etching and etching techniques, and then forming an organic light-emitting layer 104 on the first electrodes.

As in other embodiments of the present invention, the preparation process of the first electrode layer and the organic light-emitting layer 104 is not limited to this. Any technique in prior art that is able to prepare the first electrode layer and the organic light-emitting layer 104 may also be used.

S2, forming second electrodes on the organic light-emitting layer 104 by means of mask and evaporation coating technique, wherein the second electrodes are connected in series in a first direction so as to form a plurality of first conductive units 105 arranged in parallel.

As in other embodiments of the present invention, the patterning method of the second electrodes is not limited to this. Any preparation technique in prior art that is able to achieve patterning of the second electrodes may also be used.

S3, forming a first encapsulation layer 106 that covers all of the first conductive units 105 on the substrate 101, and in particular, using flash evaporation-ultraviolet curing technique to form a polyacrylic ester layer, and using reactive sputtering technique to form an aluminum oxide layer.

As in other embodiments of the present invention, the preparation technique of the first encapsulation layer 106 can be selected according to the material that is used, which can also achieve the purpose of the present invention and are also within the protection scope of the present invention.

S4, forming a conductive layer on the first encapsulation layer by means of sputtering technique, this conductive layer being ITO in the present embodiment, and then, by means of photo-etching technique, this conductive layer is patterned into a plurality of second conductive units 107 arranged in parallel in a second direction, so as to form a touch control layer.

As in other embodiments of the present invention, the second conductive units 107 may also be directly formed by means of mask or by means of printing.

S5, forming a second encapsulation layer 108 that covers all of the second conductive units 107 on the substrate 101 by means of coating technique.

Before the step S1, the method further comprises a step of forming a drive circuit layer 102 on the substrate 101, with the same specific implementation way as prior art.

In the preparation method of the touch control display device, during the preparation process of the second electrodes, the second electrodes are formed into the first conductive units 105 that cooperate with the second conductive units 107 in the touch control layer to constitute a touch control structure, which is a simple preparation method with low process cost.

Embodiment 2

Figure 2:
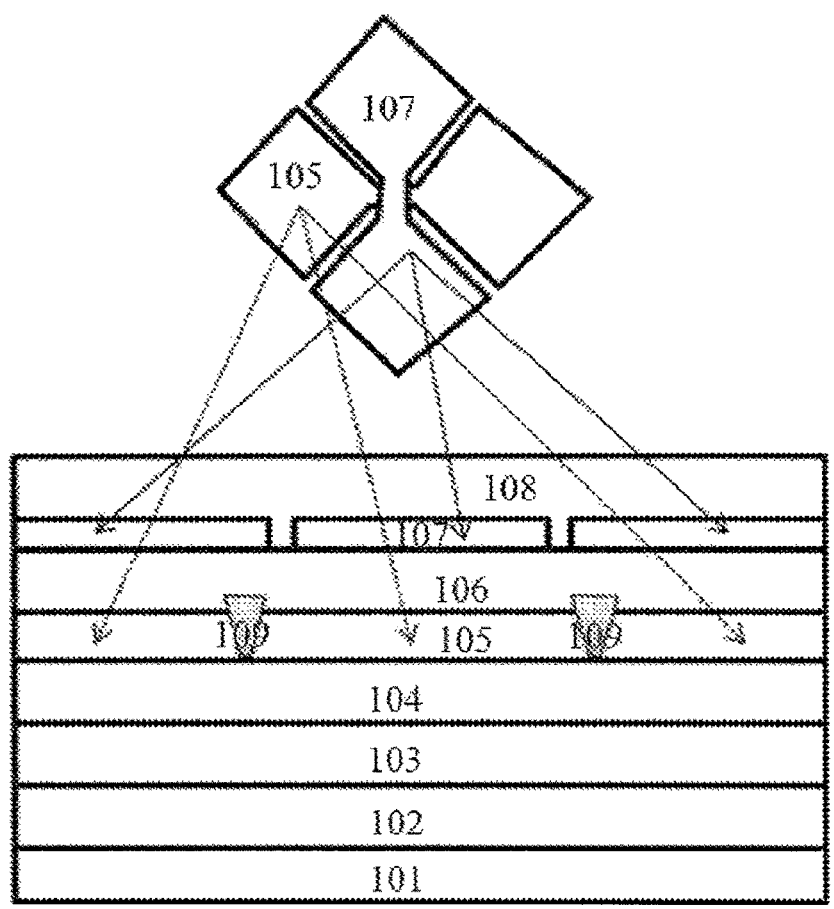
FIG. 2 is a structural schematic diagram of a touch control display device in accordance with Embodiment 2 of the present invention.

The present embodiment provides a touch control display device, as shown in FIG. 2, with specific structure and implementation way that is similar to Embodiment 1, wherein the first conductive units 105 and the second conductive units 107 have the same pattern which consists of rhombus shapes connected by conductive bands.

As being different from Embodiment 1, in the present embodiment, separating pillars 109 adapted for separating the second electrodes are configured on the substrate 101, so as to rendering the first conductive units 105 insulated from one another.

The separating pillars 109 may be provided directly upon the drive circuit layer 102 or directly upon the first electrode layer 103, or may be provided on a pixel limiting layer adapted for delimiting the pixel units and arranged on the first electrode layer 103, while in this embodiment the separating pillars 209 are preferably configured directly upon the drive circuit layer.

The separating pillar layer may be various types of dielectric material layer, while in this embodiment is preferably a photo-resist layer which may be prepared directly by coating and photo-etching technique.

Embodiment 3

Figure 3:
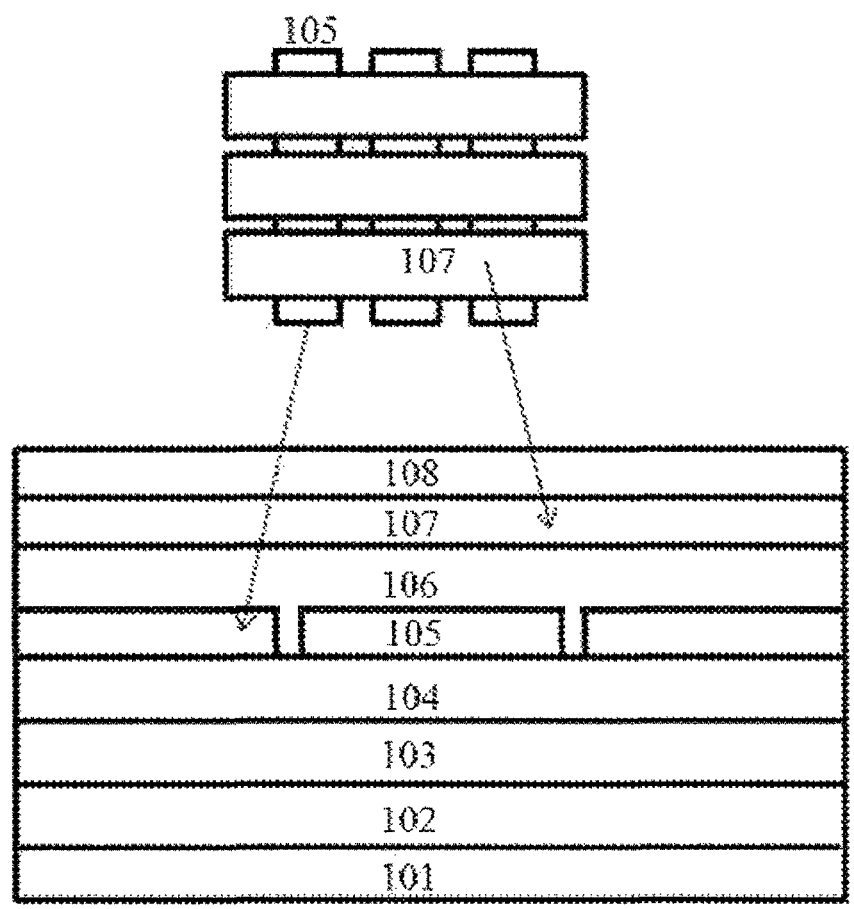
FIG. 3 is a structural schematic diagram of a touch control display device in accordance with Embodiment 3 of the present invention.

The present embodiment provides a touch control display device, as shown in FIG. 3, with specific structure and implementation way that is similar to Embodiment 1, while the difference is that the combined pattern of the first conductive units 105 and the second conductive units 107 are perpendicularly crossed bar shapes.

Apparently, the aforementioned embodiments are merely examples illustrated for clearly describing the present invention, rather than limiting the implementation ways thereof. For those skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present invention.

The invention claimed is:

1. A touch control display device, comprising
a substrate, and
a plurality of organic light-emitting diodes arranged on the substrate, each of which includes a first electrode, an organic light-emitting layer and a second electrode stacked in sequence, the first electrodes being arranged close to the substrate,
characterized in comprising a first encapsulation layer, a touch control layer and a second encapsulation layer stacked in sequence upon the organic light-emitting diodes,
wherein,
the first electrodes in all of the organic light-emitting diodes are arranged to be separated from each other;

the second electrodes in each row of the organic light-emitting diodes are connected in series in the same layer in a first direction so as to form a plurality of first conductive units;

the touch control layer comprises a plurality of second conductive units arranged in parallel in a second direction, the first conductive units and the second conductive units are configured to be insulated from each other and to form a cross network which constitutes a touch control structure wherein a touch control signal can be sensed between one of the first conductive units and one of the second conductive units.

2. The touch control display device in accordance with claim 1, characterized in that, the first conductive units and the second conductive units have the same pattern.

3. The touch control display device in accordance with claim 1, characterized in that, the touch control layer has a thickness of 5 nm-200 nm.

4. The touch control display device in accordance with claim 1, characterized in that, the second electrodes have a thickness of 1 nm-500 nm.

5. The touch control display device in accordance with claim 1, characterized in that, the first direction is orthogonal to the second direction.

6. The touch control display device in accordance with claim 1, characterized in that, the first conductive units and the second conductive units are each formed as a transparent or semi-transparent conductive layer.

7. The touch control display device in accordance with claim 1, characterized in that, the first encapsulation layer and the second encapsulation layer each comprises a single layer of or alternately arranged multiple layers of organic films and/or inorganic films.

8. The touch control display device in accordance with claim 7, characterized in that, the first encapsulation layer has a thickness of 50 nm-5 µm; the second encapsulation layer has a thickness of 50 nm-5 µm.

9. The touch control display device in accordance with claim 1, characterized in that, a drive circuit layer is arranged between the substrate and all of the organic light-emitting diodes, circuits in the drive circuit layer are adapted for actuating all of the organic light-emitting diodes.

10. A preparation method of the touch control display device in accordance with claim 1, characterized in comprising the following steps:

S1, forming first electrodes that are arranged to be separated from each other on the substrate, and forming an organic light-emitting layer on the first electrodes;

S2, forming second electrodes on the organic light-emitting layer, wherein the second electrodes are connected in series in the same layer in a first direction so as to form a plurality of first conductive units arranged in parallel;

S3, forming a first encapsulation layer that covers all of the first conductive units on the substrate;

S4, forming a conductive layer on the first encapsulation layer, and this conductive layer is patterned into a plurality of second conductive units arranged in parallel in a second direction, wherein the first conductive units and the second conductive units are insulated from each other and form a cross network which constitutes a touch control structure wherein a touch control signal can be sensed between one of the first conductive units and one of the second conductive units;

S5, forming a second encapsulation layer that covers all of the second conductive units on the substrate.

11. The preparation method in accordance with claim 10, characterized in further comprising a step of forming a drive circuit layer on the substrate before the step S1.

12. The preparation method in accordance with claim 10, characterized in that, the second conductive units are directly formed by means of mask or by means of printing in the step S4.

* * * * *